(12) United States Patent
Artmann et al.

(10) Patent No.: US 8,481,427 B2
(45) Date of Patent: Jul. 9, 2013

(54) METHOD FOR MANUFACTURING A MICROMECHANICAL COMPONENT, AND MICROMECHANICAL COMPONENT

(75) Inventors: Hans Artmann, Boeblingen-Dagersheim (DE); Andrea Urban, Stuttgart (DE); Arnim Hoechst, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 925 days.

(21) Appl. No.: 11/921,999

(22) PCT Filed: Apr. 27, 2006

(86) PCT No.: PCT/EP2006/061898
§ 371 (c)(1),
(2), (4) Date: Jun. 29, 2010

(87) PCT Pub. No.: WO2007/000363
PCT Pub. Date: Jan. 4, 2007

(65) Prior Publication Data
US 2010/0260974 A1    Oct. 14, 2010

(30) Foreign Application Priority Data
Jun. 27, 2005   (DE) .......................... 10 2005 029 803

(51) Int. Cl.
*H01L 21/302*    (2006.01)
(52) U.S. Cl.
USPC ................. 438/689; 216/56; 216/58; 216/62; 216/72; 438/706
(58) Field of Classification Search
None
See application file for complete search history.

(56) References Cited

U.S. PATENT DOCUMENTS

| 5,237,867 A | | 8/1993 | Cook, Jr. |
| 5,552,015 A | * | 9/1996 | Arndt et al. ....................... 216/2 |

(Continued)

FOREIGN PATENT DOCUMENTS

| DE | 4000496 | 2/1991 |
| JP | 5508915 | 12/1993 |

(Continued)

OTHER PUBLICATIONS

A. Splinter et al., "Thick Porous Silicon Formation Using Implanted Mask Technology", Sensors and Actuators, vol. B76, 2001, pp. 354-360.*

(Continued)

*Primary Examiner* — Lan Vinh
*Assistant Examiner* — Jiong-Ping Lu
(74) *Attorney, Agent, or Firm* — Kenyon & Kenyon LLP

(57) ABSTRACT

A micromechanical method for manufacturing a cavity in a substrate, and a micromechanical component manufactured with this method. In this method, in a first step a first layer is produced on or in a substrate. At least one second layer is then applied onto the first layer. An access hole is produced in this second layer. Material of the first layer and of the substrate can be dissolved out through this hole, so that a cavity is produced in the substrate beneath at least a portion of the second layer. This second layer above the cavity can subsequently be used as a membrane. In addition, the possibility also exists of depositing further layers onto the second layer, only the totality of which layers constitutes the membrane. The material of the first layer is selected so that dissolving out the material of the first layer produces a transition edge in the first layer, which edge at is at a predefinable angle between the substrate and the second layer.

7 Claims, 2 Drawing Sheets

U.S. PATENT DOCUMENTS

| | | | |
|---|---|---|---|
| 5,573,679 A * | 11/1996 | Mitchell et al. | 216/2 |
| 6,787,052 B1 | 9/2004 | Vaganov | |
| 2002/0127864 A1* | 9/2002 | Smith et al. | 438/692 |
| 2005/0052092 A1* | 3/2005 | Laermer | 310/311 |
| 2005/0133479 A1 | 6/2005 | Youngner et al. | |

FOREIGN PATENT DOCUMENTS

| | | |
|---|---|---|
| JP | 6302834 | 10/1994 |
| JP | 8501156 | 2/1996 |
| JP | 8285680 | 11/1996 |
| JP | 2005030307 | 2/2005 |
| WO | WO 93/17440 | 9/1993 |

OTHER PUBLICATIONS

International Search Report, PCT International Patent Application No. PCT/EP2006/061898, dated Jul. 19, 2006.

* cited by examiner

METHOD FOR MANUFACTURING A MICROMECHANICAL COMPONENT, AND MICROMECHANICAL COMPONENT

FIELD OF THE INVENTION

The present invention relates to a method for manufacturing a micromechanical component that has a cavity in a substrate, and a micromechanical component manufactured using said method.

BACKGROUND INFORMATION

A variety of membrane sensors are known in microsystems engineering. In a preferred manufacturing method for such a membrane sensor, firstly a membrane layer is applied onto a substrate, and then material is dissolved out of the substrate in order to produce a cavity beneath the membrane. Surface micromechanics (SMM) processes are typically used in this context. It is conventional, for example, to etch out the substrate material beneath the membrane region using an (isotropically) etching gas. Because of the isotropic etching process, this produces a perpendicular angle between the substrate material and membrane.

SUMMARY

The present invention relates to a micromechanical method for manufacturing a cavity in a substrate, and a micromechanical component manufactured with said method. In an example embodiment of this method, in a first step a first layer is applied or deposited onto a substrate. This can be done by way of a deposition process with in-situ doping. Alternatively, the layer can be produced by implantation or doping of the substrate directly into the substrate surface. Doping can be accomplished over the entire membrane region, or can be limited so that the regions in which the etching front is located after the etching process exhibit a doping differing from the substrate. In general, doping in the first layer can be accomplished homogeneously or gradually. At least one second layer is then applied onto the first layer. An access hole is produced in this second layer. Material of the first layer and of the substrate can be dissolved out through this hole, so that a cavity is produced in the substrate beneath at least a portion of the second layer. This second layer above the cavity can subsequently be used as a membrane. In addition, however, the possibility also exists of depositing further layers onto the second layer, only the totality of which layers constitutes the membrane. According to an example embodiment of the present invention, the material of the first layer is selected so that dissolving out the material of the first layer produces a transition edge in the first layer, which edge at is at a predefinable angle between the substrate and the second layer.

An advantage of a predefinable angle for the transition edge is that a non-perpendicular angle between the substrate material and the second layer (or membrane) can be produced. The non-perpendicular angle allows layer voltage coupling into the membrane to be modified and minimized.

In an example embodiment of the present invention, provision can be made for the angle of the transition edge to be predefined by the doping of the material of the first layer. For example, provision can be made for the material of the first layer to have a higher or lower level of doping, and/or to be of a different doping type, and/or to exhibit a gradient, as compared with the material of the substrate.

In summary, with the example method according to the present invention it is possible to manufacture a membrane sensor by surface micromechanics, using an isotropic etching process that predefines the angle of the transition flank (=etching flank) between the substrate and the second layer or membrane via the selection of the material of the substrate and of the first layer.

Advantageously, the material is dissolved out by gas-phase etching. Provision is made in particular for gas-phase etching with $ClF_3$ or other halogen compounds such as, for example, $XeF_2$, $BrF_2$.

A refinement of the present invention uses, in general, an isotropic etching process to dissolve out the material.

Advantageously, a semiconductor material, in particular silicon, is provided as the material for the substrate and for the first layer.

Advantageously, different layers can be applied onto the first layer. In a particular exemplary embodiment, for example, the second layer can be understood as a membrane layer. It is additionally conceivable for one or more functional layers to be applied onto the first layer. Typical functional layers are, for example, conductor traces, layers having piezoresistive resistors, evaluation circuits, and/or other electrically and/or mechanically effective layers that are usual in microsystems engineering. Furthermore, however, provision can also be made for application of an insulating layer onto the first layer. Provision can also be made, of course, for several of the aforesaid layers to be deposited successively onto the substrate or the first layer.

DETAILED DESCRIPTION OF EXAMPLE EMBODIMENTS

Figure 1:
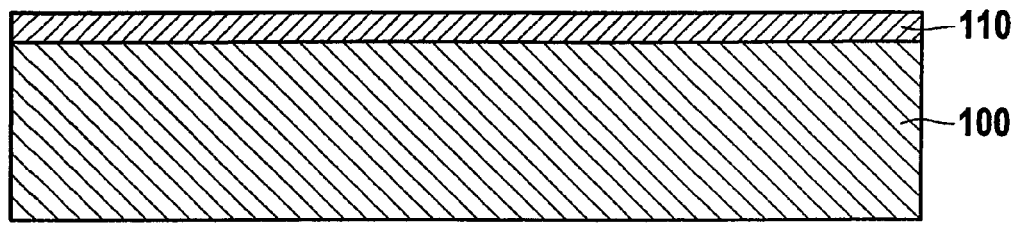
FIGS. 1 to 3 schematically show an example manufacturing method according to the present invention.

In a preferred exemplary embodiment, a silicon wafer 100 is used as a substrate for manufacturing a micromechanical component. On this silicon wafer 100, a silicon layer 110 is grown epitaxially using a common micromechanical method (see FIG. 1). In order to achieve different etching rates in substrate 100 and in first layer 110, provision is made to equip first layer 110 with a doping differing from substrate 100. Provision can be made, for example, for the material of first layer 110 to be equipped with a higher doping, but also with a lower doping, depending on the etching process used. A typical thickness provided for first layer 110 is 1 µm to 10 µm; other layer thicknesses could certainly also be used.

Figure 2:
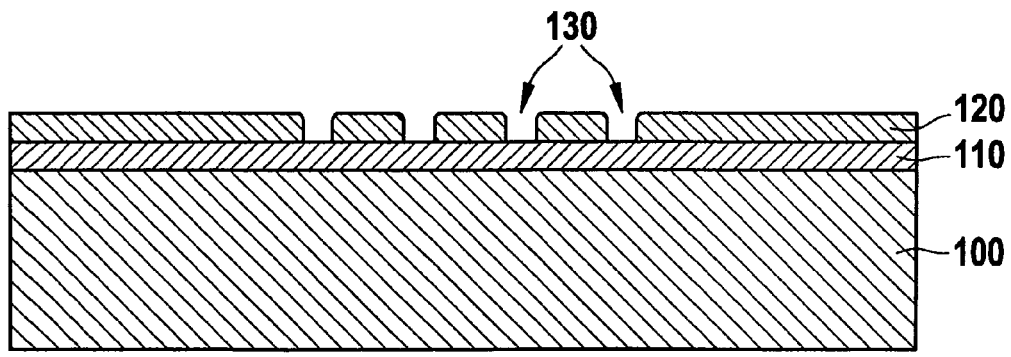

As depicted in FIG. 2, a second layer 120 is applied onto first layer 110. This second layer 120 is then patterned so that access through second layer 120 to first layer 110 is enabled through at least one access hole 130. By way of second layer 120, for example, the membrane layer over cavity 140 (yet to be manufactured) can be produced. Second layer 120 is furthermore intended to represent, very generally, a variety of layers that are applied above cavity 140. Possible in this context are functional layers as represented, for example, by membrane layers, conductor traces, evaluation circuits, piezoresistive resistors, or other electrical and/or mechanical usable layers that can be produced using micromechanical manufacturing methods. It is also possible, however, firstly to apply onto first layer 110 an insulating layer onto which, in further manufacturing methods, all further layers and functions necessary for the micromechanical component are deposited.

Access holes 130 serve for dissolving out both the material from first layer 110 and the material of substrate 100. For extended cavities or to accelerate the etching process, provision can likewise be made for multiple access holes 130 to be disposed next to one another. The spacing of access holes 130 from one another can be coordinated with the etching medium (gaseous or liquid) that is used to dissolve out the material.

Figure 3A:
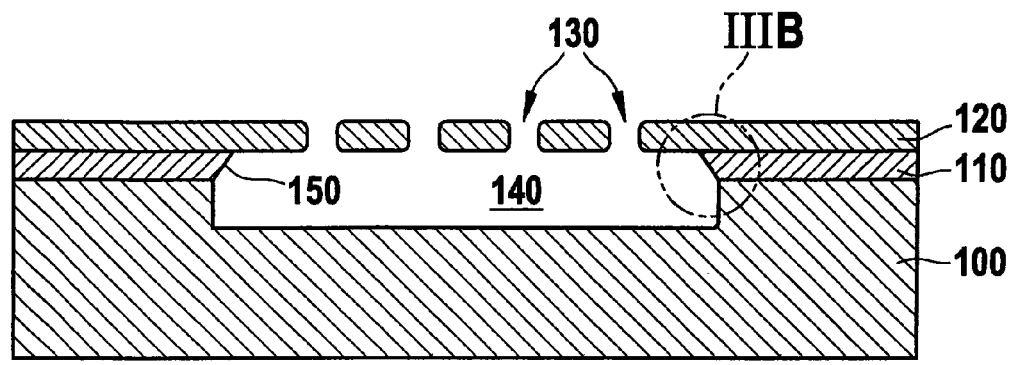

In the next step, in order to produce the cavity in the substrate, the material is dissolved out of substrate 100 and first layer 110 through access openings 130 by means of a gas-phase etching process, as shown in FIG. 3A. $ClF_3$ has proven successful as a preferred gas-phase etching process. In general, however, any etching gases that isotropically etch the semiconductor material that is used, e.g., silicon, at different speeds for different dopings are suitable. An etching flank 150 results from the different etching rates in substrate 100 and in the epitaxially applied material of first layer 110.

Figure 3B:
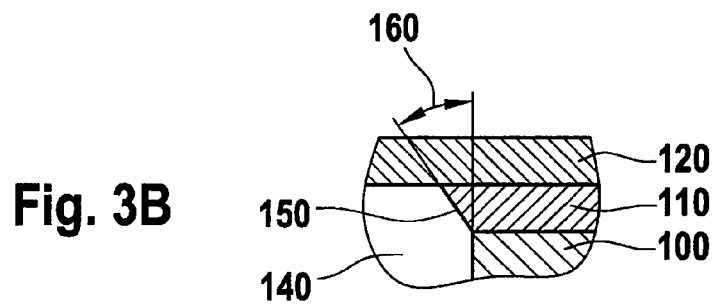

It is evident from the detail view of FIG. 3B that the different etching rates of substrate 100 and of first layer 110 result in a transition edge 150 (=etching flank) that is at an angle 160 to the line perpendicular to the applied first layer 110. This angle 160 of the etching flank or transition flank 150 can be predefined by appropriately selecting the material, the doping level and type, the doping profile or gradient, the etching gas, and the etching conditions (e.g. temperature and concentration). Selection of the angle 160 of transition flank 150 allows the layer voltage incoupling into second layer 120, or into the membrane, to be modified and minimized. This allows a more stable configuration of a micromechanical component having a cavity.

Figure 4:
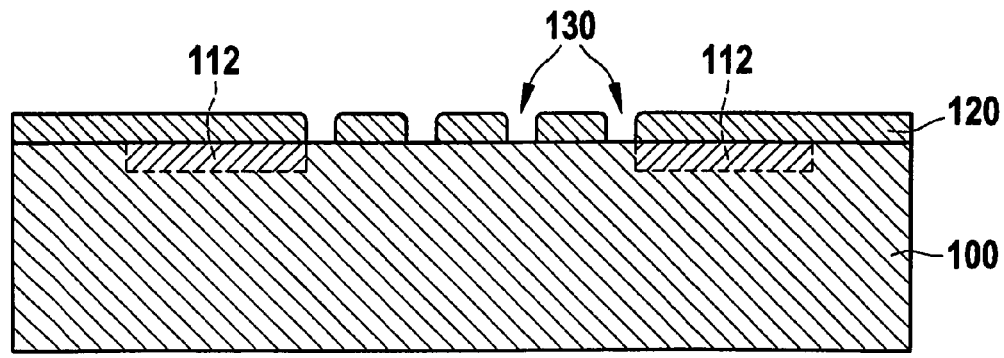
FIG. 4 shows an alternative production method for two layers that react differently to an etching operation.

Alternatively, provision can also be made to introduce first layer 112 directly into the substrate, as depicted in FIG. 4. Here, firstly a region 112 is produced in substrate 100 by means of an implantation or doping method. This region 112 can be present in more or less extended fashion in substrate 100. Region 112 is, however, notable for the fact that it forms part of the upper frame of the subsequent cavity 140, and encompasses transition edge 150 after the etching operation. Advantageously, region 112 encloses the entire edge of cavity 140; provision can also be made for region 112 to be made up of individual subregions that are not interconnected. What is critical, however, is that region 112 enclose the subsequently produced access holes through which the material of substrate 100 is dissolved out.

What is claimed is:

1. A micromechanical method for manufacturing a cavity in a substrate, comprising:
producing a first layer on or in a substrate;
applying at least one second layer onto the first layer;
producing an access hole in the second layer; and
dissolving out material of the first layer and of the substrate through the access hole to produce a cavity;
wherein:
the first layer is embodied as a doped region in the substrate;
dissolving out the material of the first layer forms a transition edge in the first layer having a predefinable angle between the second layer and the substrate; and
the angle is non-perpendicular and non-parallel.

2. The method as recited in claim 1, wherein the angle is predefined by doping material of the first layer, the angle being predefined as a function of at least one of i) doping level, ii) doping type, and iii) doping profile or doping gradient.

3. The method as recited in claim 1, wherein the material is dissolved out by gas-phase etching, using one of ClF3, or another halogen compound.

4. The method as recited in claim 3, wherein the etching is performed using one of XeF2 or BrF3.

5. The method as recited in claim 1, wherein the material is dissolved out using an isotropic etching process.

6. The method as recited in claim 1, wherein the substrate and the first layer include silicon.

7. The method as recited in claim 1, wherein the second layer is at least one of a membrane layer, a functional layer, a conductor trace, a piezoresistive resistor, and an insulating layer.

* * * * *

UNITED STATES PATENT AND TRADEMARK OFFICE
CERTIFICATE OF CORRECTION

PATENT NO. : 8,481,427 B2  Page 1 of 1
APPLICATION NO. : 11/921999
DATED : July 9, 2013
INVENTOR(S) : Artmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1594 days.

Signed and Sealed this
Eighth Day of September, 2015

Michelle K. Lee
*Director of the United States Patent and Trademark Office*